US009801298B2

(12) United States Patent
Kawano et al.

(10) Patent No.: US 9,801,298 B2
(45) Date of Patent: Oct. 24, 2017

(54) COMPOSITE MODULE

(71) Applicant: Murata Manufacturing Co., Ltd., Kyoto (JP)

(72) Inventors: Koji Kawano, Kyoto (JP); Naofumi Enkyo, Kyoto (JP); Koki Kato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 250 days.

(21) Appl. No.: 14/541,319

(22) Filed: Nov. 14, 2014

(65) Prior Publication Data

US 2015/0070852 A1    Mar. 12, 2015

Related U.S. Application Data

(63) Continuation of application No. PCT/JP2013/062520, filed on Apr. 30, 2013.

(30) Foreign Application Priority Data

May 22, 2012   (JP) ................................ 2012-116984

(51) Int. Cl.
*H05K 1/11*     (2006.01)
*H05K 1/14*     (2006.01)
(Continued)

(52) U.S. Cl.
CPC ......... *H05K 7/1427* (2013.01); *H04B 1/3888* (2013.01); *H05K 5/0217* (2013.01); *H05K 7/142* (2013.01); *H05K 7/1417* (2013.01)

(58) Field of Classification Search
CPC .... H04B 1/3833; H01R 9/223; H01R 13/506; H01L 23/3677; H01L 23/433; H01L 23/467
(Continued)

(56) References Cited

U.S. PATENT DOCUMENTS 4,912,602 A * 3/1990 Zurek ................... H04B 1/3833
                                               361/752
5,045,971 A * 9/1991 Ono ......................... H04B 1/034
                                               361/704
(Continued)

FOREIGN PATENT DOCUMENTS

JP          55-52890 U      4/1980
JP          60-113687 U     8/1985
(Continued)

OTHER PUBLICATIONS

International Search Report issued in Application No. PCT/JP2013/062520 dated Jul. 16, 2013.
(Continued)

*Primary Examiner* — Tuan T Dinh
(74) *Attorney, Agent, or Firm* — Pearne & Gordon LLP

(57) ABSTRACT

A composite module includes a plurality of substrates in a housing, prevents deformation of the stated substrates, and has a characteristic with an improved mounting precision of the substrates within the housing. A wireless LAN module as a composite module according to the present invention includes a first substrate (26), a second substrate (28) that is so disposed as opposed to the other principal surface (48*b*) of the first substrate (26), and a housing (12) that has accommodation sections (38) and (54) for accommodating the first substrate (26) and the second substrate (28). Further, substrate-support projections for supporting one principal surface and the other principal surface of each of the first substrate (26) and the second substrate (28), are formed on inner wall surfaces (40) and (56) of the accommodation sections (38) and (54) in the housing (12).

7 Claims, 3 Drawing Sheets

(51) Int. Cl.
   *H05K 7/14*     (2006.01)
   *H05K 5/02*     (2006.01)
   *H04B 1/3888*   (2015.01)

(58) Field of Classification Search
   USPC ......... 361/752–759, 807–810, 792; 439/76.2
   See application file for complete search history.

(56) References Cited

U.S. PATENT DOCUMENTS

| | | | | |
|---|---|---|---|---|
| 5,373,104 | A * | 12/1994 | Brauer | H05K 7/1417 174/562 |
| 6,224,877 | B1 * | 5/2001 | Gaikar | A61K 36/9066 424/756 |
| 6,690,582 | B2 * | 2/2004 | Sumida | B60R 16/0238 361/735 |
| 6,894,891 | B2 * | 5/2005 | Darr | H05K 7/142 361/601 |
| 7,515,426 | B2 * | 4/2009 | Depew | H01L 23/433 165/80.3 |
| 9,392,317 | B2 * | 7/2016 | Bose | H04N 21/418 |
| 2004/0043646 | A1 * | 3/2004 | Takeuchi | H01R 9/223 439/76.2 |
| 2004/0043647 | A1 * | 3/2004 | Takeuchi | H01R 13/506 439/76.2 |
| 2006/0104034 | A1 * | 5/2006 | Tsai | H01L 23/3677 361/704 |
| 2006/0181857 | A1 * | 8/2006 | Belady | H01L 23/467 361/719 |
| 2011/0075023 | A1 | 3/2011 | Saiki | |

FOREIGN PATENT DOCUMENTS

| | | |
|---|---|---|
| JP | 2005-093644 A | 4/2005 |
| JP | 2008-171837 A | 7/2008 |
| JP | 2009-260051 A | 11/2009 |
| JP | 2011-071342 A | 4/2011 |
| JP | 2011-181635 A | 9/2011 |

OTHER PUBLICATIONS

Written Opinion issued in Application No. PCT/JP2013/062520 dated Jul. 16, 2013.

* cited by examiner

COMPOSITE MODULE

BACKGROUND OF THE INVENTION

Field of the Invention

The present invention relates to composite modules including a plurality of substrates within a housing, particularly to, for example, wireless LAN modules.

Description of the Related Art

Patent Document 1 describes a circuit module using two mounting-substrates as a composite module. In this circuit module, ribs (projections) are formed on an inner wall of a housing to hold the two mounting-substrates within the housing. The structure of the circuit module is such that recesses are formed in a circumferential edge portion of each of the substrates corresponding to the above projections and the mounting-substrates are locked by the ribs and the areas surrounding the recesses.

Patent Document 1: Japanese Unexamined Patent Application Publication No. 2011-181635

BRIEF SUMMARY OF THE INVENTION

However, with the structure disclosed in Patent Document 1, because the mounting-substrates are held while being rotated in a principal surface direction thereof and locked by the ribs and the areas surrounding the recesses, there has been a problem in that the mounting-substrates deform in the principal surface direction, cannot be accommodated within the housing unless the size of each of the substrates is designed and manufactured with a high level of precision, and so on.

Accordingly, a primary object of the present invention is to provide a composite module that includes a plurality of substrates in a housing, prevents the deformation of the substrates, and has an improved mounting precision of the substrates within the housing.

A composite module according to an aspect of the present invention includes a first substrate, a second substrate that is so disposed as opposed to the other principal surface of the first substrate, and a housing that has accommodation sections for accommodating the first substrate and the second substrate. Further, substrate-support projections configured to support one principal surface and the other principal surface of each of the first substrate and the second substrate are formed on inner wall surfaces of the accommodation sections in the housing.

In the composite module according to another aspect of the present invention, it is preferable that the positions of one end of each of the substrate-support projections configured to support the one principal surface and the other principal surface of the first substrate or the second substrate be different from one another when viewing the first and second substrates from above.

In the composite module according to still another aspect of the present invention, it is preferable that a recess be formed in an edge portion of the second substrate corresponding to the substrate-support projection configured to support the first substrate.

In the composite module according to further another aspect of the present invention, it is preferable that the housing have a first housing and a second housing, the first housing be disposed on the one principal surface side of the first substrate, the second housing be disposed on the other principal surface side of the second substrate, the substrate-support projection formed in the first housing support the one principal surface of the second substrate, and the substrate-support projection formed in the second housing support the other principal surface of the first substrate.

In the composite module according to another aspect of the present invention, it is preferable that an external connector be mounted on the one principal surface of the first substrate, and the first substrate be thicker in dimension than the second substrate.

In the composite module according to the present invention, because the substrate-support projections configured to support one principal surface and the other principal surface of each of the first substrate and the second substrate are formed on the inner wall surfaces of the accommodation sections in the housing, the first substrate and the second substrate can be supported within the housing without being deformed.

Further, in the composite module according to the present invention, because the positions of one end of each of the substrate-support projections configured to support the one principal surface and the other principal surface of the first substrate or the second substrate are different from one another when viewing the first and second substrates from above, the strength in support of each of the substrates can be enhanced in comparison with a case in which each of the substrates is supported at the same positions.

Furthermore, in the composite module according to the present invention, because a recess is formed in an edge portion of the second substrate corresponding to the substrate-support projection configured to support the first substrate, the position of the second substrate is fixed so as to improve the mounting precision of the second substrate within the housing.

Moreover, in the composite module according to the present invention, because the substrate-support projection in the second housing supports the other principal surface of the first substrate, and the substrate-support projection in the first housing supports the one principal surface of the second substrate, the respective substrates are securely supported by the substrate-support projections so as to improve the arrangement precision of each of the substrates within the housing.

Still further, in the composite module according to the present invention, because an external connector is mounted on the one principal surface of the first substrate and the first substrate is thicker in dimension than the second substrate, the composite module can accept a load applied when the external connector is plugged into an electronic apparatus. In addition, since the second substrate is formed thin, the wiring precision can be improved and the through-holes formed in the second substrate can be made smaller. Moreover, since the second substrate is formed thin, the thickness of the overall composite module can be made smaller, thereby making it possible to miniaturize the composite module.

According to the present invention, it is possible to provide a composite module that includes a plurality of substrates in a housing, prevents the deformation of the substrates, and has an improved mounting precision of the substrates within the housing.

The above-mentioned primary object of the present invention as well as other objects, features, and advantages thereof will be further clarified through the following description, with reference to the appended drawings, of an embodiment in which the present invention is embodied.

BRIEF DESCRIPTION OF THE SEVERAL VIEWS OF THE DRAWINGS

FIG. 3A is a plan view of a first substrate and FIG. 3B is a plan view of a second substrate.

DETAILED DESCRIPTION OF THE INVENTION

Figure 1:
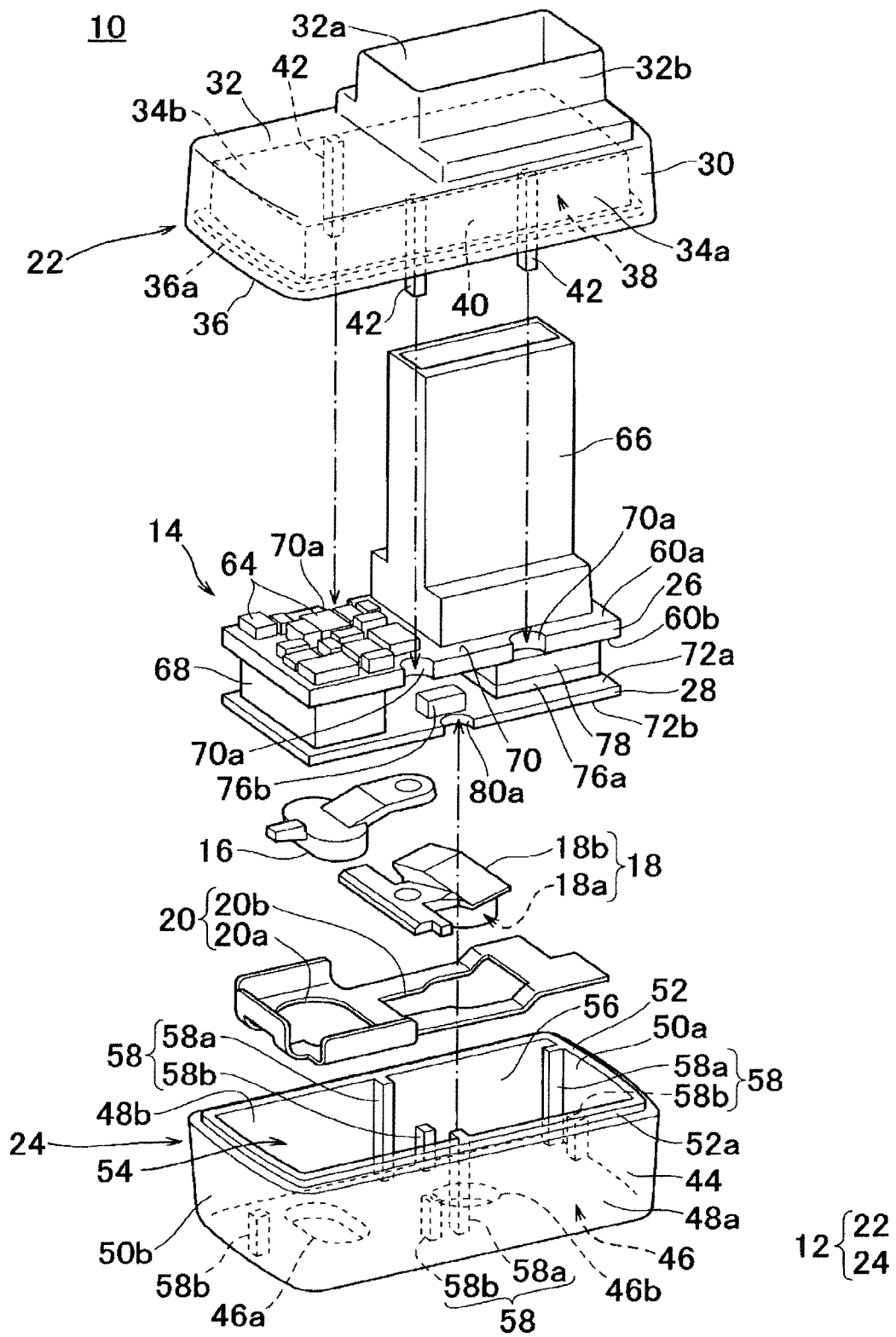
FIG. 1 is an exploded perspective view of a wireless LAN module according to a first embodiment of the present invention.
Figure 2:
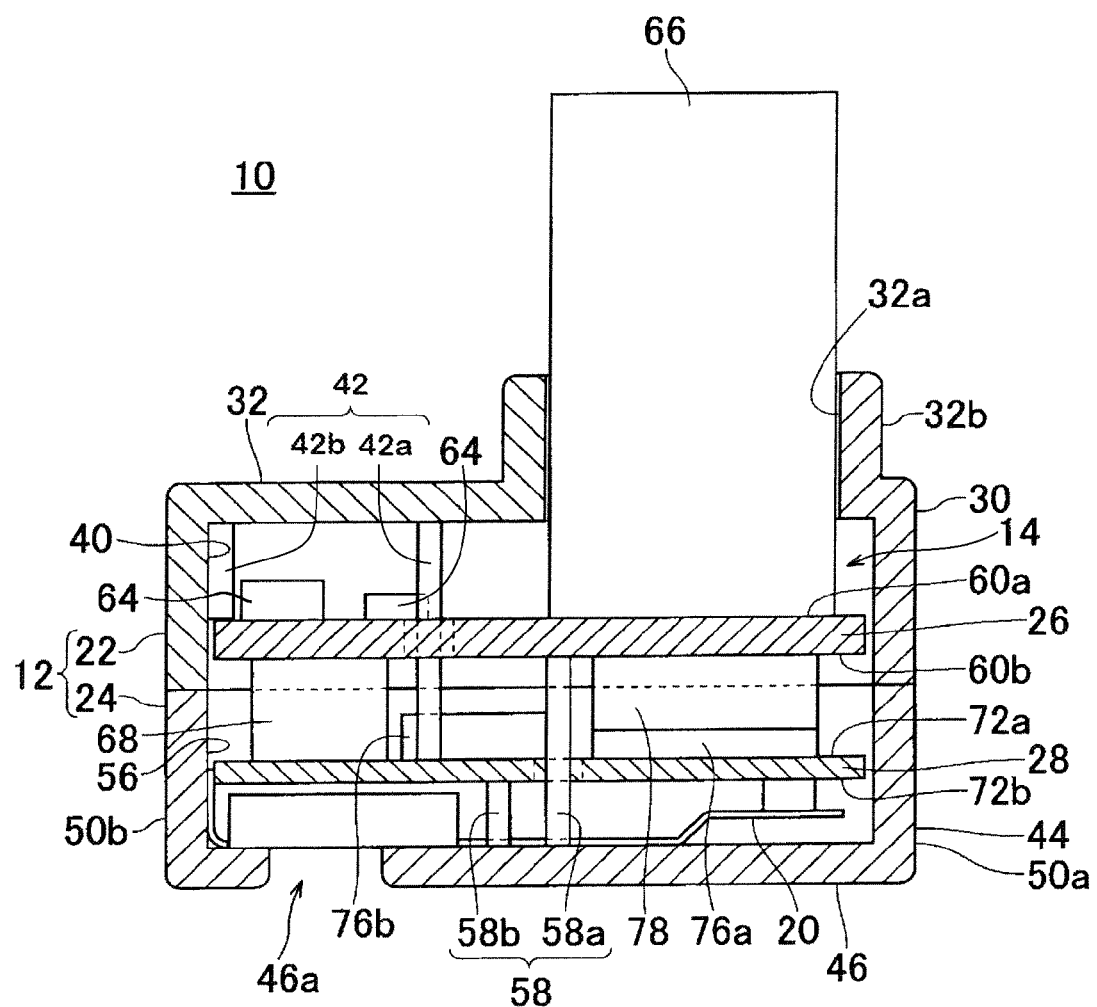
FIG. 2 is a schematic cross-sectional view of the wireless LAN module according to the first embodiment of the present invention.

Hereinafter, an example of a wireless LAN module as a composite module according to an embodiment of the present invention will be described. FIG. 1 is an exploded perspective view of a wireless LAN module according to a first embodiment of the present invention. FIG. 2 is a schematic cross-sectional view of the wireless LAN module according to the first embodiment of the present invention. A wireless LAN module 10 in the drawing is a module that is configured to, when connected with an electronic apparatus, provide the electronic apparatus with a function of wireless communication, for example.

The wireless LAN module 10 shown in FIG. 1 includes at least a housing 12 and a substrate section 14. The wireless LAN module 10 further includes a button member 16, a lens member 18, and an antenna 20.

The housing 12 is provided to accommodate at least the substrate section 14. Further, the housing 12 is provided to accommodate the button member 16, the lens member 18, and the antenna 20. The housing 12 is formed in a parallelepiped shape. The housing 12 includes a first housing 22 and a second housing 24. Here, the substrate section 14 includes, for example, a first substrate 26 and a second substrate 28.

The first housing 22 is formed in a box shape configured of a side surface portion 30 and an upper surface portion 32. The side surface portion 30 of the first housing 22 includes one side surface 34a and the other side surface 34b that extend along a long side direction and a height direction. The one side surface 34a and the other side surface 34b are so formed as opposed to each other.

A rectangular opening portion 36 is formed on the lower side of the first housing 22 (on the side opposing the upper surface portion 32). A groove 36a with its cross section being L-shaped is formed along an inner side surface of the opening portion 36. A projecting edge portion 52a of the second housing 24, which will be explained later, is fitted into the groove 36a when the first housing 22 and the second housing 24 are combined to form the housing 12.

An accommodation section 38 is provided inside the box-shaped portion configured of the side surface portion 30 and the upper surface portion 32 of the first housing 22. An inner wall surface 40 is formed on a surface of the side surface portion 30 at the accommodation section 38 side.

A plurality of substrate-support projections 42 configured to support the substrate section 14 are formed on the inner wall surface 40. Each of the substrate-support projections 42 is formed in a bar shape whose cross section is substantially circular and has one end and the other end. As schematically shown in FIG. 2, each of the substrate-support projections 42 formed in the first housing 22 includes a first substrate-support projection 42b configured to press and support one principle surface 60a of the first substrate 26 in the substrate section 14 and a second substrate-support projection 42a configured to press and support one principal surface 72a of the second substrate 28 in the substrate section 14.

In the present embodiment, the substrate-support projections 42 are formed in two separate locations at a predetermined interval on the inner wall surface 40 of the one side surface 34a in the first housing 22, and in one location on the inner wall surface 40 of the other side surface 34b, respectively. The substrate-support projection 42 is formed to have a longer length than the length from the upper surface portion 32 down to the opening portion 36, for example, and this length of the projection determines a position of the second substrate 28 in a thickness direction thereof inside the housing 12.

A connector opening portion 32a is formed in the upper surface portion 32 of the first housing 22. The connector opening portion 32a is formed so that an external connector 66, which will be explained later, is inserted therethrough and mounted. A cylindrical portion 32b is formed in a cylinder shape in the connector opening portion 32a so as to support the external connector 66.

The second housing 24 is formed in a box shape configured of a side surface portion 44 and a bottom surface portion 46. The side surface portion 44 of the second housing 24 includes one side surface 48a and the other side surface 48b that extend along the long side direction and the height direction, and also includes one end surface 50a and the other end surface 50b that extend along a short side direction and the height direction. The one side surface 48a and the other side surface 48b are so formed as opposed to each other, and the one end surface 50a and the other end surface 50b are also so formed as opposed to each other. Further, a button opening portion 46a and a lens opening portion 46b are formed in the bottom surface portion 46.

A rectangular opening portion 52 is formed on the upper side of the second housing 24 (on the side opposing to the bottom surface portion 46). The projecting edge portion 52a is formed along an edge at substantially the inside of the opening portion 52. The projecting edge portion 52a is fitted into the above-mentioned groove 36a of the first housing 22 when the first housing 22 and the second housing 24 are combined to form the housing 12.

An accommodation section 54 is provided inside the box-shaped portion configured of the side surface portion 44 and the bottom surface portion 46 of the second housing 24. An inner wall surface 56 is formed on a surface of the side surface portion 44 at the accommodation section 54 side.

A plurality of substrate-support projections 58 configured to support the substrate section 14 are formed on the inner wall surface 56. Each of the substrate-support projections 58 formed in the second housing 24 includes a first substrate-support projection 58a configured to hold and support the first substrate 26 of the substrate section 14 and a second substrate-support projection 58b configured to hold and support the second substrate 28 of the substrate section 14. The first substrate-support projection 58a and the second substrate-support projection 58b are each formed in a bar shape whose cross section is substantially circular and each have one end and the other end.

In the present embodiment, the first substrate-support projections 58a are formed in a location on the inner wall surface 56 of the one side surface 48a, a location on the inner wall surface 56 of the other side surface 48b, and a location on the inner wall surface 56 of the one end surface 50a of the second housing 24, respectively. Each of the first substrate-support projections 58a is formed to have a length extending from the bottom surface portion 46 up to the opening portion 52 of the second housing 24, for example. The lengths of the first substrate-support projections 58a are the same. The length of the first substrate-support projection 58a determines a position of the first substrate 26 in a thickness direction thereof inside the housing 12. Further, in the second housing 24, the second substrate-support projections 58b are formed in a location on the inner wall surface 56 of the one side surface 48a, a location on the inner wall surface 56 of the other side surface 48b, a location on the inner wall surface 56 of the one end surface 50a, and a location on the inner wall surface 56 of the other end surface 50b, respectively, in a manner in which the locations of the second substrate-support projections 58b are different from those of the corresponding first substrate-support projections 58a, in other words, the first and second substrate-support projections 58a and 58b are provided at predetermined intervals therebetween. Each of the second substrate-support projections 58b is formed to have a length which is halfway the length from the bottom surface portion 46 up to the opening portion 52 of the second housing 24, for example. The lengths of the second substrate-support projections 58b are the same. The length of each of the second substrate-support projections 58b determines a position of the second substrate 28 in the thickness direction thereof inside the housing 12.

Figure 3A:
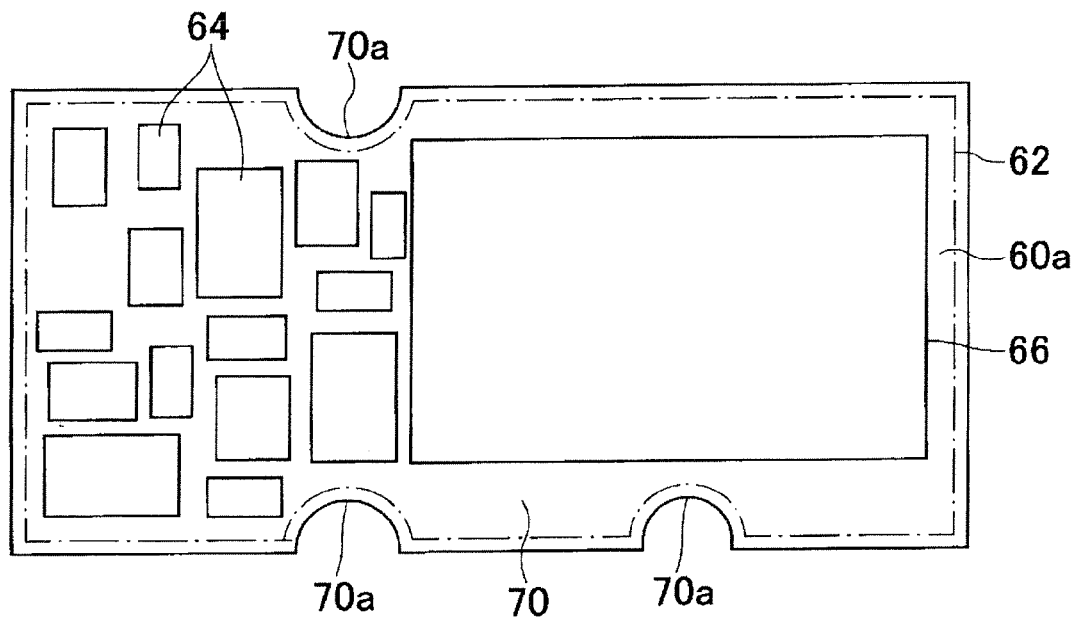
FIGS. 3A and 3B are plan views of a substrate section according to the present invention, where
Figure 3B:
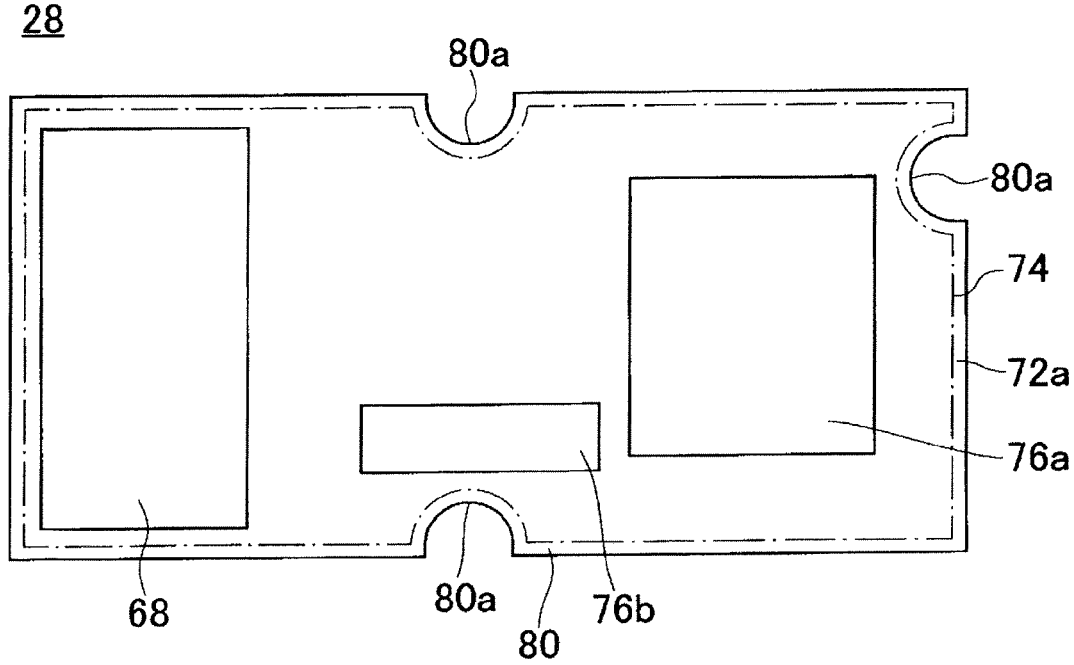

Next, the substrate section 14 will be described below. FIGS. 3A and 3B are plan views of the substrate section according to the present invention. FIG. 3A is a plan view of the first substrate, while FIG. 3B is a plan view of the second substrate. The substrate section 14 includes the first substrate 26 and the second substrate 28. The first substrate 26 and the second substrate 28 are formed of, for example, print substrates or the like. The first substrate 26 is formed to have a larger thickness than the second substrate 28.

The first substrate 26 is formed in a rectangular plate shape, and includes one principal surface 60a and the other principal surface 60b. A first function block 62 configured to implement a predetermined function is disposed on the one principal surface 60a of the first substrate 26, having a wiring pattern (not shown) and mounting electronic component devices 64 therein. The electronic component devices 64 mounted in the function block 62, include, for example, electronic component devices 64 related to a power supply circuit. The electronic component devices 64 are, for example, coil components such as DC-DC converters and the like. Accordingly, the electronic component devices 64 related to the power supply circuit and the like that are mounted in the first function block 62 are so arranged as opposed to the upper surface portion 32 of the first housing 22 when the first substrate 26 is accommodated in the housing 12. Further, the external connector 66 is mounted in a region which is on one end portion side of the one principal surface 60a of the first substrate 26 and which is other than an area where the electronic component devices 64 related to the power supply circuit and the like are mounted in the first function block 62. A 5-pin or 8-pin USB connector is used for the external connector 66. A substrate joint connector 68 is provided on the other end side of the other principal surface 60b of the first substrate 26 so as to mechanically connect the first substrate 26 and the second substrate 28 together at a desired interval therebetween in the thickness direction of the respective substrates.

An edge portion 70 is provided along an outer circumference of the first substrate 26. A plurality of recesses 70a having a semicircular shape are provided in the edge portion 70 of the first substrate 26 corresponding to the substrate-support projections 42 formed in the first housing 22, for example. The recesses 70a are provided in a total of three locations, for example, on the long sides in the edge portion 70. Accordingly, the substrate-support projections 42 formed in the first housing 22 are inserted through the recesses 70a and mounted. Then, the edge portion 70 of the other principal surface 60b of the first substrate 26 is supported as being held by one end of each of the first substrate-support projections 58a formed in three locations on the inner wall surface 56 of the second housing 24.

The second substrate 28 is formed in a rectangular plate shape, and includes the one principal surface 72a and the other principal surface 72b. The one principal surface 72a of the second substrate 28 is so disposed as opposed to the other principal surface 60b of the first substrate 26 at a desired interval therebetween in the thickness direction of the respective substrates via the substrate joint connector 68. The size of the outer shape of the second substrate 28 is approximately the same as that of the first substrate 26. A second function block 74 configured to implement a predetermined function which is different from the function of the first function block 62 is disposed on the one principal surface 72a of the second substrate 28, having a wiring pattern (not shown) and mounting electronic component devices 76a and 76b therein. Because the electronic component devices 64 mounted in the first function block 62 and the electronic component devices 76a and 76b mounted in the second function block 74 are arranged, for example, so as to sandwich the first substrate 26 therebetween, the electronic component devices mounted in the respective function blocks are arranged so as not to directly oppose each other.

As the electronic component devices 76a and 76b mounted in the second function block 74, electronic component devices related to control circuits such as a wireless LAN IC, a micro control unit (MCU), and so on can be cited, for example. The electronic component device 76a is disposed on the one principal surface 72a of the second substrate 28, which is a region opposing the one principal surface 60a of the first substrate 26 on which the external connector 66 is mounted while sandwiching the first substrate 26 therebetween. In other words, the electronic component device 76a is mounted on the one principal surface 72a of the second substrate 28, which is a region on a side immediately under the surface where the external connector 66 is mounted. Note that the electronic component device 76a mounted in the second function block 74 is an electronic component device that generates a relatively high temperature heat.

Here, for example, in the case where the operation of writing into a ROM that is included in the MCU is executed, the writing and reading modes are set in a hardware-controlled manner in which the terminal mode-setting is made by potential at a setting terminal. Accordingly, by drawing out a setting terminal necessary for the terminal mode-setting to the substrate joint connector 68, the terminal mode-setting (potential) can be set to the writing mode at a time of testing a single substrate, and set to the reading mode in a connector board of the composite module.

Note that because the first substrate 26 is formed to be thicker in dimension than the second substrate 28, the composite module can accept a load applied thereto at a time when plugging into the external connector 66 is performed. In addition, since the second substrate 28 is formed thinner, the wiring precision can be improved and the through-holes formed in the second substrate 28 can be made smaller.

In the substrate section 14, the first function block 62 is disposed in the first substrate 26, and the second function block 74 is disposed in the second substrate 28, which is distanced from the first substrate 26. This can reduce the interference of the signals or the like between the two function blocks. In addition, because the first function block 62 and the second function block 74 are disposed so as not to directly oppose each other, it is possible to further enhance an effect of reducing the above-mentioned interference. Accordingly, the electric characteristics of the wireless LAN module 10 can be prevented from being deteriorated.

Further, because the electronic component devices 64 related to a power supply circuit, such as coil components of a DC-DC converter or the like, are included in the first function block 62, a magnetic field generated by the coil components can cause coupling with the electronic component devices of the other function block. However, because the upper surface portion 32 of the first housing 22 and the electronic component devices 64 related to the power supply circuit and the like that are mounted in the first function block 62 are so arranged as opposed to each other when the first substrate 26 is accommodated in the housing 12, the coupling with other electronic component devices accommodated within the housing 12 can be suppressed.

Furthermore, the external connector 66 is mounted in a region which is on the one end portion side of the one principal surface 60a of the first substrate 26 and which is other than an area where the electronic component devices 64 related to the power supply circuit and the like are mounted in the first function block 62. This makes it possible to further enhance the effect of suppressing the interference between the function blocks because the external connector 66 suppresses the spread of a magnetic field generated in the electronic component devices 64 related to the power supply circuit, such as coil components of a DC-DC converter or the like, in the first function block 62.

Moreover, a ground electrode may be provided on the one principal surface 60a of the first substrate 26 or at the inside of the first substrate 26; in addition, the ground electrode (not shown) may be provided on the one principal surface 72a of the second substrate 28 or at the inside of the second substrate 28. With the ground electrode formed on the first substrate 26 or the second substrate 28, the interference between a function block in an area surrounded by the ground electrode and a function block in an area not surrounded by the ground electrode can be reduced. Accordingly, the electric characteristics of the wireless LAN module 10 can be further prevented from being deteriorated.

A heat dissipation member 78 is disposed on an upper surface of the electronic component device 76a (in other words, a surface on the opposite side to the surface where the electronic component device 76a is mounted on the second substrate 28). The heat dissipation member 78 has a function to absorb the heat generated in the electronic component device 76a and serves as a buffer with respect to the first substrate 26 and the second substrate 28. The heat dissipation member 78 is disposed between the first substrate 26 and the second substrate 28. A surface of the heat dissipation member 78 on the opposite side to the upper surface of the electronic component device 76a is in contact with the other principal surface 60b of the first substrate 26. Accordingly, the heat dissipation member 78 is so disposed as opposed to a lower surface of the external connector 66 sandwiching the first substrate 26 therebetween. In addition, the heat dissipation member 78 has a size capable of covering at least the upper surface of the electronic component device 76a. As a material of the heat dissipation member 78, a resin with high thermal conductivity is used, that is, a silicon resin containing ceramics-based or metal-based filler is preferably used, for example.

An edge portion 80 is provided along an outer circumference of the second substrate 28. A plurality of recesses 80a having a semicircular shape are provided in the edge portion 80 of the second substrate 28 corresponding to the first substrate-support projections 58a formed in the second housing 24, for example. The recesses 80a are provided in a total of three locations, for example, on the sides in the edge portion 80 except the other end side where the substrate joint connector 68 is provided. Accordingly, the first substrate-support projections 58a are inserted through the recesses 80a and mounted. Then, the edge portion 80 of the one principal surface 72a of the second substrate 28 is supported as being pressed by one end of each of the substrate-support projections 42 formed on the inner wall surface 40 of the first housing 22; the other principal surface 72b of the second substrate 28 is supported as being held by one end of each of the second substrate-support projections 58b formed on the inner wall surface 56 of the second housing 24. Note that the positions at which the edge portion 80 of the one principal surface 72a of the second substrate 28 is supported as being pressed by the one end of each of the substrate-support projections 42 formed on the inner wall surface 40 of the first housing 22, and the positions at which the edge portion 80 of the other principal surface 72b of the second substrate 28 is supported as being held by the one end of each of the second substrate-support projections 58b formed on the inner wall surface 56 of the second housing 24, are different from one another in the second substrate 28 when viewing the second substrate 28 from above.

Providing the substrate joint connector 68 between the other principal surface 60b of the first substrate 26 and the one principal surface 72a of the second substrate 28 so as to connect the stated substrates together, makes it possible to increase the heat capacity of the substrate section 14; in addition, because the heat generated in the electronic component device 76a can be transferred toward the first substrate 26 through the substrate joint connector 68, the heat generated in the electronic component device 76a can be efficiently dissipated.

Further, since the heat dissipation member 78 is provided, the heat generated in the electronic component device 76a is absorbed by the heat dissipation member 78, and the absorbed heat is transferred to the external connector 66 so as to be dissipated, through the external connector 66, to an electronic apparatus to which the wireless LAN module 10 is connected. Accordingly, because the heat generated in the electronic component device 76a can be efficiently dissipated, the characteristics of the various electronic component devices mounted in the module and the characteristics of the wireless LAN module 10 can be prevented from being deteriorated.

In the case where only the external connector 66 needs to be changed, the change thereof can be carried out only by changing the first substrate 26 on which the external connector 66 is mounted, without changing the second substrate 28 on which the electronic component devices 76a, 76b related to the control circuits and the like are mounted.

The button member 16 is provided to execute, for example, a starting operation or rest operation for communication when performing the ID certification with a connection destination apparatus with which the wireless connection is established using the wireless LAN module 10, and so on.

The lens member 18 includes a lens 18a and a lens holder 18b. The lens 18a is provided to lead a light from an LED lamp (not shown) indicating an operation state of the wireless LAN module 10 to the exterior of the housing 12. The lens holder 18b is provided to hold the lens 18a.

The antenna 20 is provided to transmit/receive the radio waves through which the wireless communication is carried out with external wireless LAN terminals or the like. The antenna 20 is formed in a rectangular plate shape, and a button opening portion 20a and a lens opening portion 20b are formed therein. The antenna 20 is disposed on the other principal surface 72b side of the second substrate 28, for example. The antenna 20 is so disposed as to make contact with the bottom surface portion 46 of the second housing 24 when the antenna 20 is accommodated in the housing 12.

The substrate section 14 mainly makes contact with the housing 12 via the substrate-support projections 42 and 58; the antenna 20 is disposed on the other principal surface 72b side of the second substrate 28, and is so disposed as to make contact with the bottom surface portion 46 of the second housing 24 when it is accommodated in the housing 12. Accordingly, the heat generated in the electronic component device 76a can be dissipated to the housing 12. This makes it possible to further efficiently dissipate the heat generated inside the wireless LAN module 10.

With the wireless LAN module 10 according to the present invention, the edge portion 70 of the other principal surface 60b of the first substrate 26 is supported as being held by the one end of each of the first substrate-support projections 58a formed in three locations on the inner wall surface 56 of the second housing 24, the edge portion 80 of the one principal surface 72a of the second substrate 28 is supported as being pressed by the one end of each of the substrate-support projections 42 formed on the inner wall surface 40 of the first housing 22, and the other principal surface 72b of the second substrate 28 is supported as being held by the one end of each of the second substrate-support projections 58b formed on the inner wall surface 56 of the second housing 24. Therefore, the first substrate 26 and the second substrate 28 are surely supported inside the housing 12 without being deformed.

Further, with the wireless LAN module 10 according to the present invention, for example, the positions at which the edge portion 80 of the one principal surface 72a of the second substrate 28 is supported as being pressed by the one end of each of the substrate-support projections 42 formed on the inner wall surface 40 of the first housing 22, and the positions at which the other principal surface 72b of the second substrate 28 is supported being held by the one end of each of the second substrate-support projections 58b formed on the inner wall surface 56 of the second housing 24, are different from one another in the second substrate 28 when viewing the second substrate 28 from above. Accordingly, the strength in support of the substrate can be enhanced in comparison with a case in which the substrate is supported at the same positions.

Furthermore, with the wireless LAN module 10 according to the present invention, for example, the plurality of recesses 80a having a semicircular shape are provided on the sides other than the other end side where the substrate joint connector 68 is provided, in the edge portion 80 of the second substrate 28 corresponding to the first substrate-support projections 58a formed in the second housing 24. Since the first substrate-support projections 58a are inserted through the recesses 80a and mounted, the position of the second substrate 28 is fixed by the first substrate-support projections 58a with respect to the long side and short side directions of the second substrate 28, whereby an improved mounting precision of the second substrate 28 within the housing 12 can be obtained.

Still further, with the wireless LAN module 10 according to the present invention, because the first substrate 26 on which the external connector 66 is mounted is formed to be thicker in dimension than the second substrate 28, the composite module can accept a load applied thereto at a time when plugging into the external connector 66 is performed. In addition, since the second substrate 28 is formed thinner, wiring precision can be improved and through-holes formed in the second substrate 28 can be made smaller. Moreover, since the second substrate 28 is formed thinner, thickness of the overall wireless LAN module 10 can be made smaller, thereby making it possible to miniaturize the wireless LAN module 10.

In the wireless LAN module according to the above-described embodiment, although recesses are formed in the edge portion of the first and second substrates so as to improve the mounting precision of the substrate section, the invention is not intended to be limited thereto; the mounting precision may be improved through other configurations.

In the wireless LAN module according to the above embodiment, the positions at which the edge portion of the one principal surface of the second substrate is supported as being pressed by the one end of each of the substrate-support projections formed on the inner wall surface of the first housing, and the positions at which the edge portion of the other principal surface of the second substrate is supported as being held by the one end of each of the second substrate-support projections formed on the inner wall surface of the second housing, are different from one another in the second substrate when viewing the second substrate from above. However, the invention is not intended to be limited thereto.

In the wireless LAN module according to the above embodiment, although a heat dissipation member is disposed on the upper surface of the electronic component device, the invention is not intended to be limited thereto and the heat dissipation member may not be disposed.

In the wireless LAN module according to the above embodiment, although the first function block is provided in the first substrate and the second function block is provided in the second substrate, the invention is not intended to be limited thereto. Further, in the wireless LAN module according to the above embodiment, although a power supply circuit is disposed in the first substrate and a digital circuit is disposed in the second substrate, the invention is not intended to be limited thereto, and a variety of modifications may be made thereupon.

In the wireless LAN module according to the above embodiment, although the first substrate is formed thicker in dimension than the second substrate, the invention is not intended to be limited thereto; the first substrate and the second substrate may be formed to have approximately the same thickness or the second substrate may be formed thicker than the first substrate.

Further, in the wireless LAN module according to the above embodiment, although the external connector is disposed on the first substrate, the invention is not intended to be limited thereto.

The composite module according to the present invention can be used to such applications in which the module is connected to an electronic apparatus serving as a home electric appliance, an AV apparatus, or the like so as to provide an additional function to the stated electronic apparatus as desired.

10 wireless LAN module
12 housing
14 substrate section
16 button member
18 lens member
18a lens 18b lens holder
20 antenna
20a button opening portion
20b lens opening portion
22 first housing
24 second housing
26 first substrate
28 second substrate
30 side surface portion
32 upper surface portion
32a connector opening portion
32b cylindrical portion
34a one side surface
34b the other side surface
36 opening portion
36a groove
38 accommodation section
40 inner wall surface
42 substrate-support projection
44 side surface portion
46 bottom surface portion
46a button opening portion
46b lens opening portion
48a one side surface
48b the other side surface
50a one end surface
50b the other end surface
52 opening portion
52a projecting edge portion
54 accommodation section
56 inner wall surface
58 substrate-support projection
58a first substrate-support projection
58b second substrate-support projection
60a one principal surface
60b the other principal surface
62 first function block
64 electronic component device
66 external connector
68 substrate joint connector
70 edge portion
70a recess
72a one principal surface
72b the other principal surface
74 second function block
76a, 76b electronic component device
78 heat dissipation member
80 edge portion
80a recess

The invention claimed is:

1. A composite module comprising:
a first substrate having one principal surface and another principal surface;
a second substrate having one principal surface and another principal surface and disposed as opposed to the another principal surface of the first substrate;
an electronic component device disposed on the one principal surface of the second substrate;
a heat dispersion member disposed on the another principal surface of the first substrate and adjacent to the electronic component device;
an external connector mounted on the one principal surface of the first substrate, wherein the first substrate is thicker in dimension than the second substrate, and wherein the external connector is aligned with and located vertically above the heat dissipation member; and
a housing having accommodation sections for accommodating the first substrate and the second substrate,
wherein the accommodation sections comprise substrate-support projections each configured to support the one principal surface and the another principal surface of the first substrate and the one principal surface and the another principal surface of the second substrate, and each of the substrate-support projections is formed on an inner wall surface of the accommodation section in the housing.

2. The composite module according to claim 1,
wherein positions of one end of each of the substrate-support projections are different from one another when viewing the first and second substrates from above.

3. The composite module according to claim 1,
wherein the second substrate comprises recesses, and each of the recesses is formed in an edge portion of the second substrate and corresponds to each of the substrate-support projections configured to support the first substrate.

4. The composite module according to claim 1,
wherein the housing has a first housing and a second housing, the first housing is disposed on a side of the one principal surface of the first substrate, the second housing is disposed on a side of the other principal surface of the second substrate, the substrate-support projections formed in the first housing support the one principal surface of the second substrate, and the substrate-support projections formed in the second housing support the other principal surface of the first substrate.

5. The composite module according to claim 2,
wherein the second substrate comprises recesses, and each of the recesses is formed in an edge portion of the second substrate and corresponds to each of the substrate-support projections configured to support the first substrate.

6. The composite module according to claim 2,
wherein the housing has a first housing and a second housing, the first housing is disposed on a side of the one principal surface of the first substrate, the second housing is disposed on a side of the other principal surface of the second substrate, the substrate-support projections formed in the first housing support the one principal surface of the second substrate, and the substrate-support projections formed in the second housing support the other principal surface of the first substrate.

7. The composite module according to claim 3,
wherein the housing has a first housing and a second housing, the first housing is disposed on a side of the one principal surface of the first substrate, the second housing is disposed on a side of the other principal surface of the second substrate, the substrate-support projections formed in the first housing support the one principal surface of the second substrate, and the substrate-support projections formed in the second housing support the other principal surface of the first substrate.

* * * * *